(12) United States Patent
Syzdek et al.

(10) Patent No.: US 7,259,999 B2
(45) Date of Patent: Aug. 21, 2007

(54) NON-VOLATILE MEMORY CELL ARRAY FOR IMPROVED DATA RETENTION AND METHOD OF OPERATING THEREOF

(75) Inventors: Ronald J. Syzdek, Austin, TX (US); Gowrishankar L. Chindalore, Austin, TX (US); Paul A. Ingersoll, Austin, TX (US); Peter J. Kuhn, Austin, TX (US)

(73) Assignee: Freescale Semiconductor, Inc, Austin, TX (US)

( * ) Notice: Subject to any disclaimer, the term of this patent is extended or adjusted under 35 U.S.C. 154(b) by 114 days.

(21) Appl. No.: 11/258,745

(22) Filed: Oct. 26, 2005

(65) Prior Publication Data

US 2007/0091690 A1    Apr. 26, 2007

(51) Int. Cl.
    *G11C 7/10*    (2006.01)
(52) U.S. Cl. .................... 365/189.04; 365/185.29; 365/185.14
(58) Field of Classification Search ........... 365/189.04, 365/185.29, 185.14, 185.2, 185.22, 185.33
    See application file for complete search history.

(56) References Cited

U.S. PATENT DOCUMENTS

| 6,172,910 | B1 * | 1/2001 | Lee ..................... 365/185.22 |
| 6,344,994 | B1 | 2/2002 | Hamilton |
| 6,717,848 | B2 * | 4/2004 | Kim et al. ............. 365/185.03 |
| 2004/0208056 | A9 | 10/2004 | Sim |

* cited by examiner

*Primary Examiner*—Richard T. Elms
*Assistant Examiner*—Dang Nguyen

(57) ABSTRACT

A method is provided which includes erasing a first plurality of non-volatile memory bit cells in a memory block comprising a third plurality of memory bit cells during an erase procedure, such that upon completion of the erase procedure, the first plurality of non-volatile memory bit cells are at an erased state. The method also includes programming a second plurality of non-volatile memory bit cells in the memory block during the erase procedure, such that the second plurality of non-volatile memory bit cells is a subset of the third plurality of memory bit cells and upon completion of the erase procedure, the second plurality of non-volatile memory bit cells are at a programmed state.

20 Claims, 4 Drawing Sheets

NON-VOLATILE MEMORY CELL ARRAY FOR IMPROVED DATA RETENTION AND METHOD OF OPERATING THEREOF

BACKGROUND

1. Field of the Disclosure

Typically, integrated circuit memories are organized into one or more arrays or blocks, each including a matrix of rows and columns, with a memory cell located at each intersection of a row and a column. The case of non-volatile memory arrays, such as flash memory arrays, is no different, and includes a plurality of rows or word lines and a plurality of columns or bit lines. A non-volatile memory bit cell is located at the intersection of each of the word lines and bit lines within the memory array.

A common problem associated with flash memory arrays is the presence of mobile ion contaminates. Such mobile ion contaminates may originate from outside of the memory block, and travel freely to locations within the memory block. Mobile ion contaminates can be attracted to the charges stored on non-volatile memory cells and can change the charge state of the memory cell thereby causing data corruption and data loss.

Accordingly, the industry needs a non-volatile memory capable of reducing the data retention fall out effects cause by mobile ion contaminates. Particularly, the industry continues to need an apparatus and method for operating a non-volatile memory array with improved data retention capabilities in light of mobile ion contaminates.

2. Description of the Related Art

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DESCRIPTION OF THE PREFERRED EMBODIMENTS

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this disclosure belongs. All publications, patent applications, patents, and other references mentioned herein are incorporated by reference in their entirety. In case of conflict, the present specification, including definitions, will control. In addition, the materials, methods, and examples are illustrative only and not intended to be limiting. Other features and advantages of the disclosure will be apparent from the following detailed description, and from the claims. To the extent not described herein, many details regarding specific materials, processing acts, and circuits are conventional and thereby known by those skilled in the art associated with the present disclosure.

For the purposes of this disclosure, the terms "memory bit cell" and "non-volatile memory bit cell" are used interchangeably and refer to a non-volatile memory bit cell as described in accordance with any of the embodiments herein.

Figure 1:
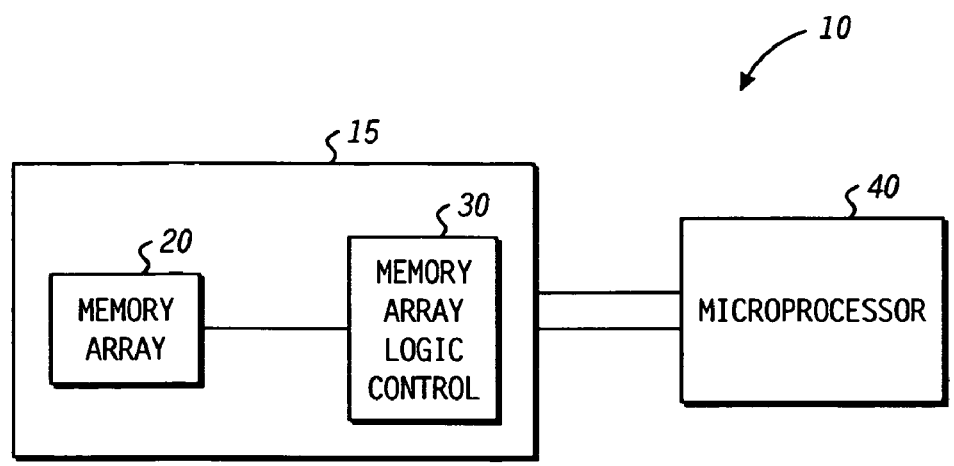
FIG. 1 is a block diagram of an information storage device containing a memory array in accordance with the embodiments of the present disclosure.

FIG. 1 illustrates a block diagram of system 10 that includes a microprocessor 40 operably connected to a memory unit 15, which includes a memory array 20 and a memory array logic control 30 in accordance with one embodiment of the present disclosure. The microprocessor can include any conventional or proprietary microprocessor for executing a variety of commands and procedures. The system 10 may represent a single integrated circuit or system whereby microprocessor 40 and memory unit 15 are present on a single integrated circuit, or alternatively the memory unit 15 and microprocessor 40 can be on separate integrated circuits.

The memory array logic control 30 manages functions of the memory array 20, such as erase, program, and read procedures and can include conventional and proprietary components such as sense amps and logic devices. The memory array 20 can include a plurality of memory blocks, each memory block includes a plurality of non-volatile memory bit cells, each memory bit cell is associated with a word line and bit line as is understood in the art. Each block of the memory array 20 includes a plurality of user accessible memory bit cells and dummy memory bit cells as will be described in more detail below. The provision of dummy memory bit cells at a peripheral region of a memory block facilitates the attraction of mobile ions by maintaining a programmed state thereby reducing the potential for data corruption at memory bit cells containing user programmed information, thereby improving the data retention.

Figure 2:
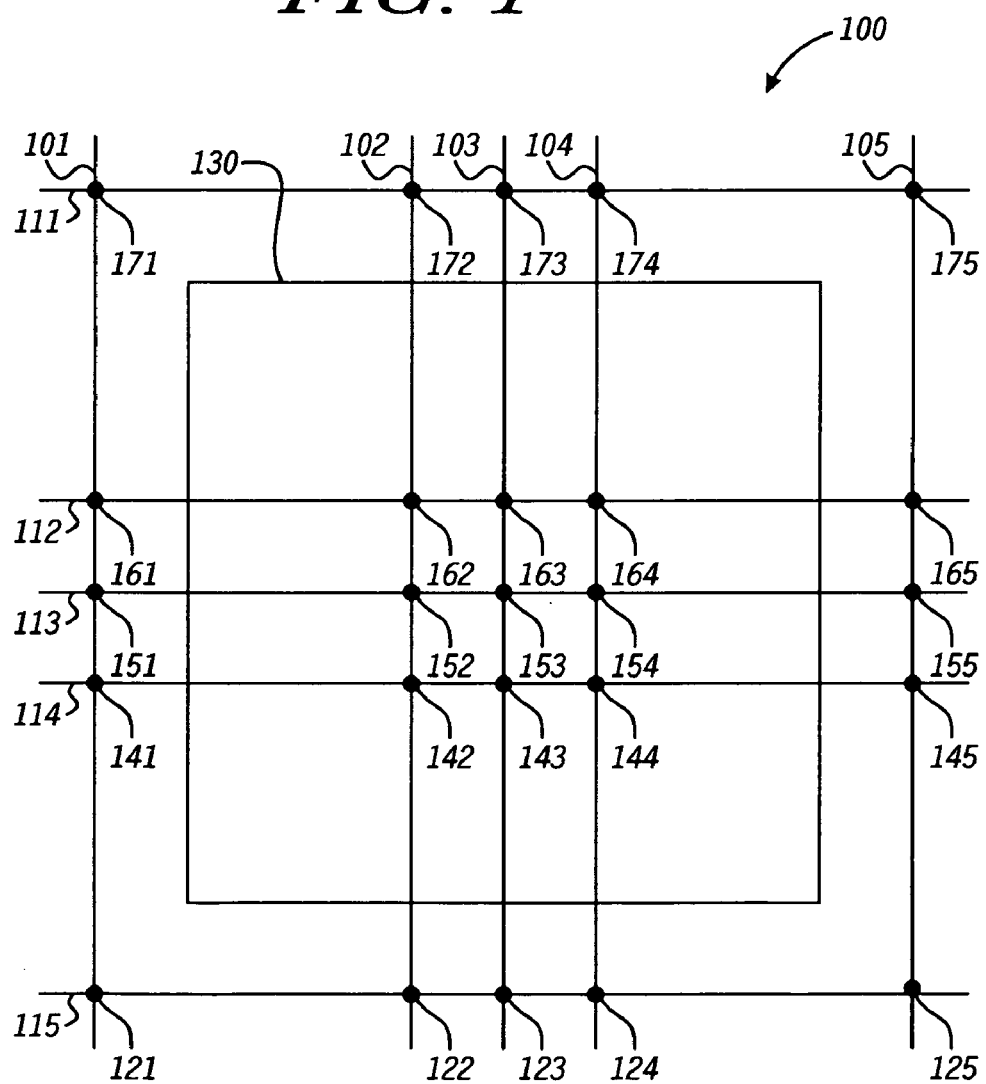
FIG. 2 is an illustration of a memory block in accordance with embodiments of the present disclosure.

FIG. 2 illustrates a memory block 100 comprising an array of non-volatile memory bit cells located at the intersection of word lines 111, 112, 113, 114, and 115 (111-115) and bit lines 101, 102, 103, 104, and 105 (101-105). FIG. 2 further illustrates region 130 of memory block 100 defining an area in which a plurality of user accessible memory bit cells is located within memory block 100. According to one embodiment, the plurality of memory bit cells located within region 130 is user accessible memory bit cells for storing user information, while the plurality of memory bit cells located outside region 130 is dummy memory bit cells. The dummy memory bit cells are not capable of storing user information as they are typically used as buffer structures to assure uniform processing of the bit cells that are capable of storing user information, such as those bit cells located within the interior of the array, within region 130.

According to FIG. 2, word lines 112, 113, and 114 are user accessible word lines, each of which are associated with a plurality of user accessible non-volatile memory bit cells within region 130 and a plurality of dummy memory bit cells outside region 130. It will be noted that user accessible word lines 112-114 of memory block 100 include user accessible bit cells disposed between dummy memory bit cells of the user accessible bit line. For example, FIG. 2 illustrates user accessible word line 114 having a plurality of user accessible memory bit cells 142-144 disposed between dummy memory bit cells 141 and 145.

Referring to FIG. 2, a plurality of dummy memory bit cells 171-175 are located on dummy word line 111 and a plurality of dummy memory bit cells 121-125 are located on dummy word line 115, where dummy word lines are associated with only dummy memory bit cells. eg., there are no user accessible bit cells associated with a dummy word line. FIG. 2 further illustrates dummy bit cells that are associated only with dummy bit lines. Referring to FIG. 2, dummy bit line 101 includes dummy memory bit cells 121, 141, 151, 161, and 171, while dummy bit line 105 includes dummy memory bit cells 125, 145, 155, 165, and 175. As illustrated in FIG. 2, and discussed previously, the user accessible word lines 112-114 include both user accessible memory bit cells located within region 130, and dummy memory bit cells associated with the dummy bit lines 101 and 105 and located outside of region 130.

The arrangement of memory bit cells illustrated in FIG. 2, illustrates dummy bit cells located outside of region 130, i.e., the periphery region surrounding the user accessible memory bit cells of region 130. This arrangement facilitates a region of dummy memory bit cells capable of having a suitable charge or bias level for attracting mobile ions generated outside memory block 100. The attraction of mobile ions to dummy memory bit cells reduces the probability that a mobile ion will be attracted to a user accessible memory bit cell thereby possibly corrupting user information stored at the user accessible memory bit cell. The arrangement of dummy memory bit cells in relation to user accessible memory bit cells, as discussed above, does not preclude alternate arrangements. For example, other embodiments may utilize multiple dummy word lines and bit lines.

In accordance with a specific embodiment of the present disclosure, during an erase procedure the user accessible bit cells of memory block 100 are erased while the dummy bit cells during are programmed. By assuring dummy bit cells have a charge associated with a programmed state, the dummy bit cells are capable of impeding the movement of the mobile ions and reduce interference of mobile ions with user accessible bit cells.

For example, one erase procedure associated with the memory array 10 would be a bulk erase procedure. In a specific embodiment, the erase procedure would erase the plurality of non-volatile memory bit cells 141-145 of word line 114 during a first portion of the erase procedure, while a second portion of the erase procedure would program the non-volatile dummy memory bit cells 141 and 145 of word line 114 prior to completion of the erase procedure. As a result, upon completion of the erase procedure, the dummy bit cells of word line 114 are at a programmed state while the user word lines are erased.

Figure 3:
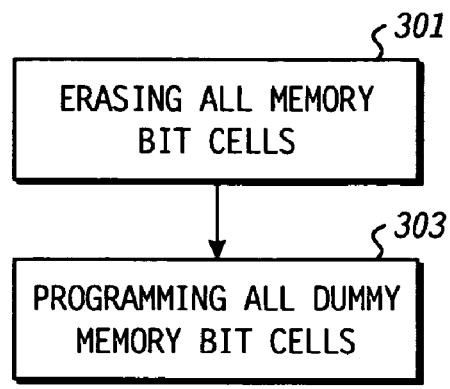
FIG. 3 is a flow chart illustrating a particular erase procedure for operating the memory block illustrated in FIG. 2.

FIG. 3 illustrates an erase procedure that is a bulk erase procedure for a memory block, such as memory block 100 of FIG. 2. At 301, FIG. 3 provides placing all memory bit cells of the memory block in an erased state. At 303, FIG. 3 further provides that the erase procedure includes programming the plurality of non-volatile dummy memory bit cells of the memory block after being erased. According to one embodiment, programming the plurality of dummy memory bit cells includes programming dummy memory bit cells associated with the dummy word lines 111 and 115, and the dummy bit lines 101 and 105. Generally, programming a memory bit cell includes providing an amount of charge to a floating gate of the non-volatile memory bit cell such that a sense amplifier will detect the memory bit cell as being in a programmed state when the word line is biased during a read of the non-volatile memory bit cell. According to a particular embodiment, programming includes storing electrons at a non-volatile memory floating gate as is known in the art during applications utilizing a memory array, such as by a user during operation or a during test verification. It will be appreciated that the bulk erase procedure can be carried out at a variety of times, such as during a factory erase of the memory array before consumer handling, or during a user initiate erase procedure. It will also be appreciated that a charge storage structure, such as a floating gate of the non-volatile memory bit cell may include materials such as silicon, silicon nitrides, silicon dioxide, and the like, or a combination thereof. The floating gate may also include a combination of materials, for example, discontinuous storage elements of silicon substantially surrounded by a dielectric material.

Figure 4:
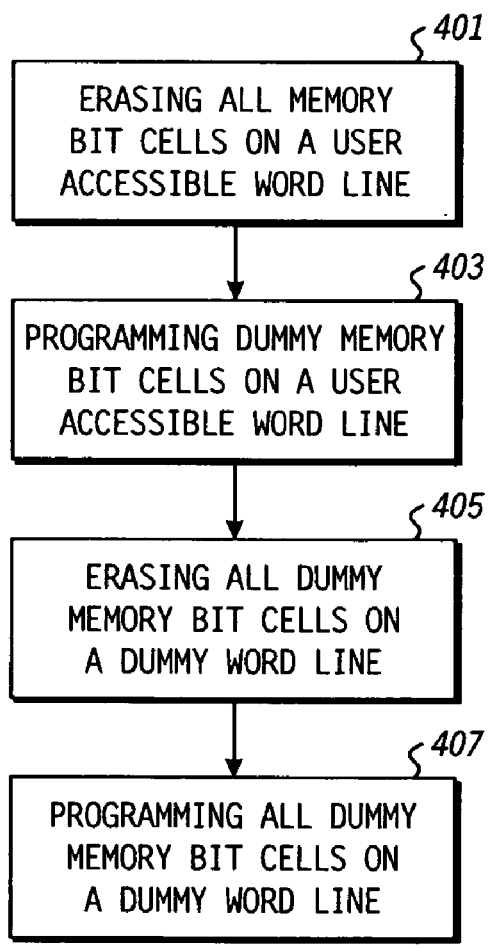
FIG. 4 is a flow chart illustrating a particular erase procedure for operating the memory block illustrated in FIG. 2.

FIG. 4 illustrates a more detailed embodiment of accomplishing the erase procedure of FIG. 3. According to FIG. 4 at 401, erasing memory bit cells occurs on a word line by word line basis that includes erasing all memory bit cells associated with each user accessible word line, such that upon completion of a first portion of the erase procedure, the plurality of memory bit cells of a word line are at an erased state. Referring to FIG. 2, erasing all the memory bit cells associated with user accessible word line includes erasing the dummy memory bit cells and user accessible memory bit cells associated with user accessible word lines 112-114.

FIG. 4 further provides a second portion of the erase procedure that includes programming the dummy memory bit cells on the user accessible word line, such that upon completion of the erase procedure, the dummy memory bit cells are at a programmed state at 403. Referring to FIG. 2, programming the dummy memory bit cells on a user accessible word line includes, for example, programming dummy memory bit cells 161 and 165 of user accessible word line 112. Such a process can be repeated for a plurality of dummy memory bit cells on a plurality of user accessible word lines.

FIG. 4 further provides a third portion of the erase procedure that includes erasing all dummy memory bit cells on a dummy word line, such that upon completion of the third portion of the erase procedure all dummy memory bit cells on a dummy word line are at an erased state at 405. Referring to FIG. 2, erasing all dummy memory bit cells on a dummy word line includes, for example, erasing dummy memory bit cells 171-175 associated with dummy word line 111. Such a process can be repeated for a plurality of dummy memory bit cells on a plurality of dummy word lines.

At 407, FIG. 4 provides a fourth portion of the erase procedure that includes programming all dummy memory bit cells on a dummy word line such that upon completion of the fourth portion of the erase procedure the dummy memory bit cells associated with the dummy word line are at a programmed state. Referring to FIG. 2, programming all the dummy memory bit cells on a dummy word line includes, for example, programming dummy memory bit cells 171-175 associated with dummy word line 111. Such a process can be repeated for a plurality of dummy memory bit cells on a plurality of dummy word lines.

Figure 5:
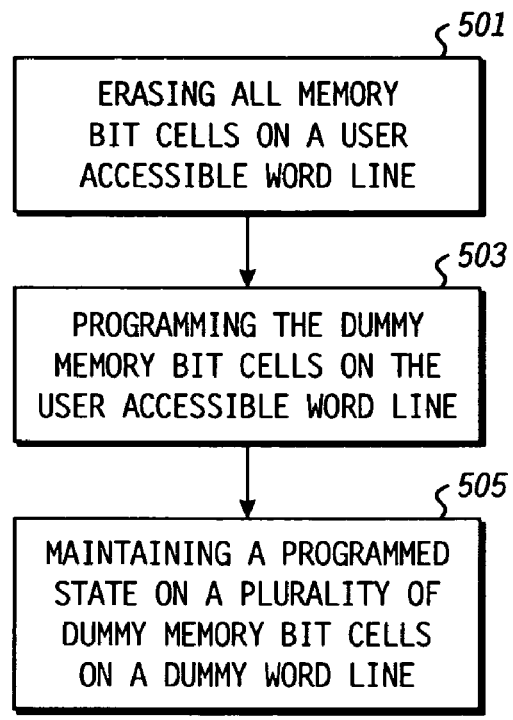
FIG. 5 is a flow chart illustrating a particular erase procedure for operating the memory block illustrated in FIG. 2.

Referring to FIG.5, another embodiment provides an erase procedure for the memory block 100 illustrated in FIG. 2. According to FIG. 5, a first portion of the erase procedure includes erasing all memory bit cells on a user accessible word line at 501. Referring to FIG. 2, erasing all memory bit cells associated with a user accessible word line includes erasing for example, memory bit cells 161-165 associated with user accessible word line 112. Such a process can be repeated for a plurality of memory bit cells on a plurality of user accessible word lines.

At 503, FIG. 5 further provides a second portion of an erase procedure that includes programming the dummy memory bit cells on the user accessible word line. As illustrated in FIG. 2, user accessible word line 112 includes dummy memory bit cells 161 and 165, which, according to this embodiment, can be programmed such that upon completion of the second portion of the erase procedure dummy memory bit cells 161 and 165 are at a programmed state. Such a process can be repeated for a plurality of dummy memory bit cells on a plurality of user accessible word lines.

At 505, FIG. 5 further provides a third portion of an erase procedure that includes, maintaining a programmed state on a plurality of dummy memory bit cells on a dummy word line. Upon completion of the third portion of the erase procedure, the plurality of dummy memory bit cells on the dummy word line are at a programmed state. Referring to FIG. 2 for example, a programmed state can be maintained on dummy memory bit cells 171-175 associated with dummy word line 111. Such a process can repeated for a plurality of dummy memory bit cells on a plurality of dummy word lines. It will be appreciated that maintaining a programmed state on a plurality of dummy memory bit cells can be achieved in an active or passive manner. For example, a passive way of maintaining a programmed state on a plurality of dummy memory bit cells would be to do nothing, i.e., neither add nor remove charge. In this manner the program state of the dummy bit cells associated with the dummy word line would be maintained. An active way of maintaining a programmed state on a plurality of dummy memory bit cells would be to provide an appropriate charge to the dummy memory bit cells associated with the dummy word line, thereby assuring the dummy memory bit cells remain in a programmed state.

Generally, maintaining a programmed state can include maintaining a suitable charge at particular memory bit cell such that the logic control senses a bias level indicating a programmed state for that particular memory bit cell. Still, maintaining a programmed state can also include providing or removing a charge at a particular memory bit cell. In such instances, the memory bit cell will remain at a programmed state as long as the memory logic control senses a bias level indicating a programmed state for that particular memory bit cell. Various methods can be employed for maintaining a programmed state, for example, providing an individual voltage driver for an individual word line.

Figure 6:
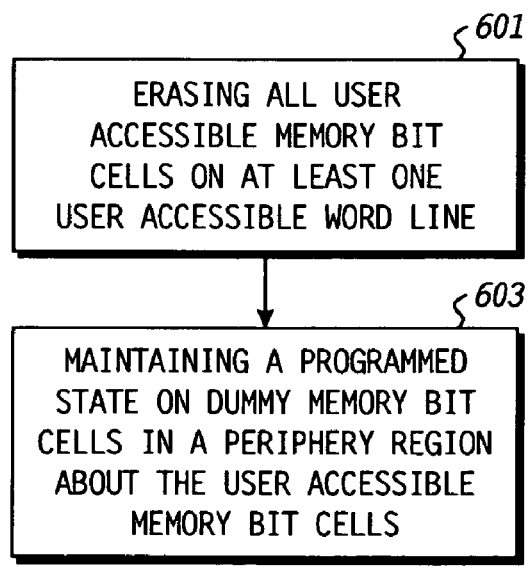
FIG. 6 is a flow chart illustrating a particular erase procedure for operating the memory block illustrated in FIG. 2.

FIG. 6 provides a first portion of an erase procedure including erasing all user accessible memory bit cells on at least one user accessible word line at 601, such that upon completion of the first portion of the erase procedure all user accessible memory bit cells associated with the at least one user accessible word line are at an erased state. Referring to FIG. 2, erasing all user accessible memory bit cells on at least one user accessible word line includes, for example, erasing memory bit cells 162-164 on user accessible word line 112. Such a process can be repeated for a plurality of user accessible memory bit cells on a plurality of user accessible word lines.

Additionally, FIG. 6 provides a second portion of an erase procedure including maintaining a programmed state on a plurality of dummy memory bit cells in a periphery region about the user accessible memory bit cells at 603. During the erase procedure of FIG. 6 the dummy memory bit cells of the periphery region are maintained at a programmed state. Referring to FIG. 2, maintaining a programmed state on dummy memory bit cells in a periphery region includes, for example, maintaining a programmed state on dummy memory bit cells associated with dummy word lines 111 and 115, as well as maintaining a programmed state on dummy memory bit cells associated with dummy memory bit lines 101 and 105.

Note that maintaining a programmed state at a dummy memory bit cell can include providing a charge, such as a charge that would be associated with an erased state for user accessible memory bit cells so long as the added charge does not cause a bias state of the dummy memory bit cell to reach a bias level that would be detected as a an erased state.

Figure 7:
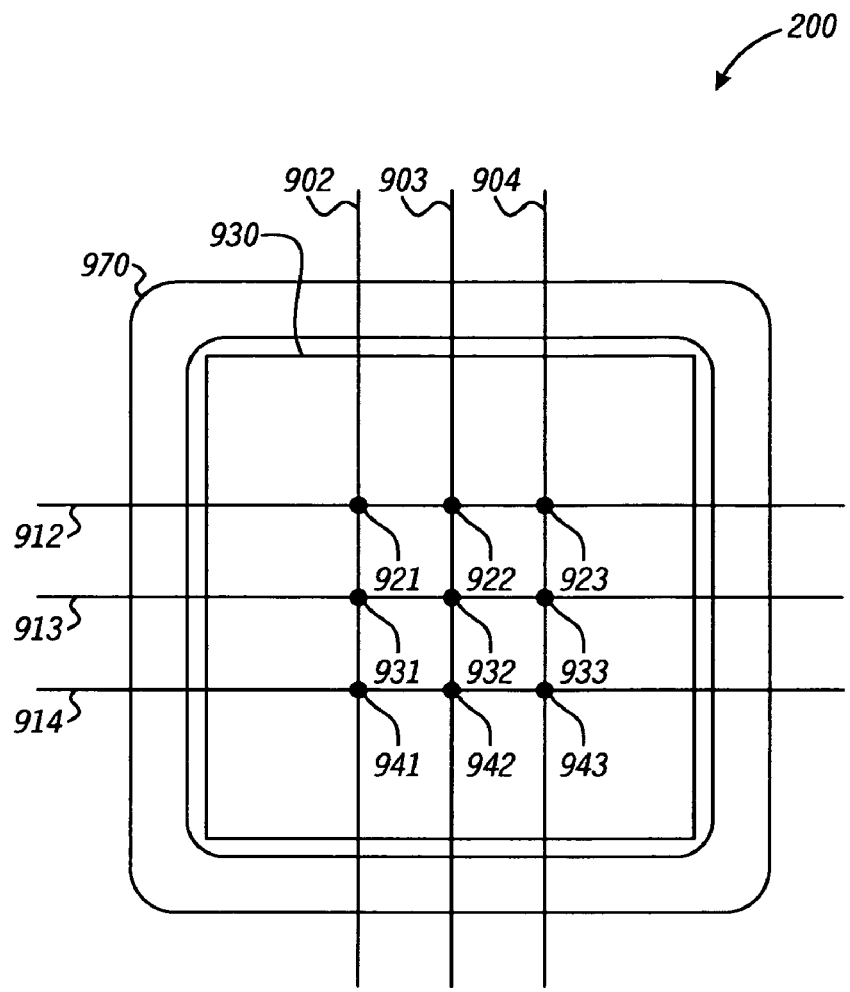
FIG. 7 is an alternate embodiment of a memory block in accordance with an embodiment of the present disclosure.

FIG. 7 illustrates an alternate embodiment of a memory block 200. The memory block 200 includes a plurality of user accessible word lines 912, 913, and 914 (912-914), a plurality of bit lines 902, 903, and 904 (902-904), and a plurality of non-volatile memory bit cells located at the intersection of each of the user accessible word lines 912-914 and bit lines 902-904. The user accessible memory bit cells of the memory block 200 are located with region 930 and associated with user accessible word lines 912-914 and bit lines 902-904. As described previously, user accessible memory bit cells are capable of storing user programmed information. Memory block 200 also includes periphery region 970 located at a periphery region of the memory block 200 that surrounds the user accessible memory bit cells of region 930.

In one embodiment, periphery region 970 includes a layer of material continuous along and abutting two or more user accessible bit cells. In one embodiment, the layer of material in periphery region 970 overlies an active region of the memory array, and is capable of storing a charge in a manner similar to a programmed state or erased state. In a particular embodiment, periphery region 970 includes one or more non-volatile charge storage structures that can include dummy bit cells or other dummy structures that are continuous along a plurality of memory bit cells in region 930. In another particular embodiment, the layer of charge storage material forming a dummy structure in periphery region 970 is continuous, that is, not etched or segmented such that the layer of material surrounds and is continuous along all of the memory bit cells within region 930. Alternatively, there can be a plurality of segmented dummy structures in periphery region 970, each continuous along two or more user accessible bit cells. It will be appreciated, that in one embodiment, control gates need not be provided under the charge storage layer of periphery region 970. For simplicity, the dummy structures within periphery region 970 can include one or more floating gate structures formed at the same time as the floating gates of the memory cells within region 930. Periphery region structure 970 facilitates impeding the movement of mobile ions to user accessible memory bit cells and reduces interference of mobile ions with user accessible memory bit cells. This in turn reduces data loss or the corruption of stored data. It will be appreciated that periphery region 970 can also be representative of a plurality of dummy memory cells as previously discussed.

Figure 8:
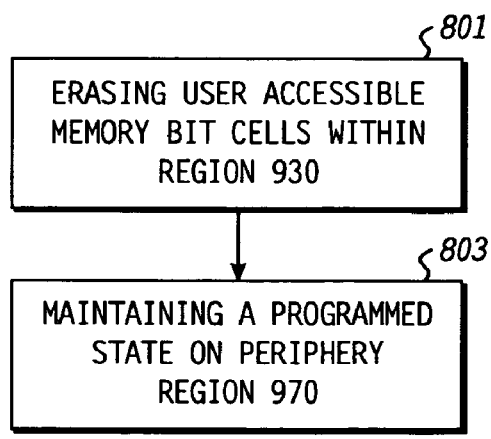
FIG. 8 is a flow chart illustrating a particular erase procedure for operating the memory block illustrated in FIG. 9.

FIG. 8 provides a method for erasing the memory block 200 illustrated in FIG. 7. As illustrated in FIG. 8 at 801, a first portion of the erase procedure includes erasing user accessible memory bit cells in region 930, such that upon completion of this portion of the erase procedure the user accessible memory bit cells within region 930 are at an erased state. According to a particular embodiment, erasing the user accessible memory bit cells within region 930 can include a bulk erase procedure.

At 803, FIG. 8 provides a second portion of the erase procedure that includes maintaining a charge representative of a programmed state on a periphery region 970, such that upon completion of the second portion of the erase procedure the periphery region 970 is at a programmed state. Generally, maintaining a programmed state on periphery region 970 can include maintaining any variety of suitable charge states or a suitable bias level that would be detected as representative of a programmed state.

Reference has been made to programmed states and erased states of memory bit cells in accordance with the embodiments disclosed herein. It should be appreciated that the terms "programmed state" and "erased state" refer to respective states of a bit cell based upon an amount charge stored at the bit cell that are differentially detectable by a sense amplifier. Accordingly, a programmed state for a user accessible memory bit cell and a dummy memory bit cell may include the same bias level or a different bias level, though both bias levels would be detectable as a programmed state. As such, a bias level indicating a programmed state on a user accessible memory bit cell is generally within a range of about 3-4 volts above a charge neutral condition. Accordingly, a programmed state on a dummy memory bit cell (or periphery region structure) includes a bias level that can be approximately the same as the bias level of a user memory bit cell or greater. For example, a dummy memory bit cell, or the charge storage structure of region 970, can be programmed to a value substantially the same as the user accessible memory bit cell at a programmed state. In a particular embodiment, the dummy memory bit cells are programmed by providing a bias level having a value of about 1.5 times greater than the bias level of a user accessible memory bit cell at a programmed state. Still, in another embodiment, a programmed state on a dummy memory bit cell may be indicated by a bias level not less than about 1.5 times or more than the bias level on a user accessible memory bit cell at a programmed state, such as particularly within a range of between about 4-7 volts above a charge neutral condition.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

In the foregoing specification, principles of the disclosure have been described above in connection with specific embodiments. However, one of ordinary skill in the art appreciates that one or more modifications or one or more other changes can be made to any one or more of the embodiments without departing from the scope of the disclosure as set forth in the claims below. Accordingly, the specification and figures are to be regarded in an illustrative rather than a restrictive sense and any and all such modifications and other changes are intended to be included within the scope of disclosure.

What is claimed is:

1. A method comprising:
    erasing a first plurality of non-volatile memory bit cells in a memory block comprising a third plurality of memory bit cells during an erase procedure, wherein upon completion of the erase procedure the first plurality of non-volatile memory bit cells are at an erased state;
    programming a second plurality of non-volatile memory bit cells in the memory block during the erase procedure, wherein the second plurality of non-volatile memory bit cells is a subset of the third plurality of non-volatile memory bit cells and upon completion of the erase procedure the second plurality of non-volatile memory bit cells are at a programmed state.

2. The method of claim 1, wherein the first plurality of non-volatile memory bit cells are user accessible non-volatile memory bit cells.

3. The method of claim 2, wherein during an erase procedure the first plurality of non-volatile memory bit cells and the second plurality of non-volatile memory bit cells are associated with a plurality of word lines, wherein the word lines are user accessible word lines.

4. The method of claim 3, wherein the first plurality of non-volatile memory bit cells are disposed between a first portion of a second plurality of non-volatile memory bit cells and a second portion of a second plurality of non-volatile memory bit cells within at least one user accessible word line.

5. The method of claim 1, wherein the second plurality of non-volatile memory bit cells are dummy memory bit cells.

6. The method of claim 5, wherein the second plurality of non-volatile memory bit cells are associated with a dummy bit line.

7. The method of claim 5, wherein the second plurality of non-volatile memory bit cells are associated with a dummy word line.

8. The method of claim 1, wherein programming further comprises:
    maintaining a charge state on a plurality of non-volatile memory bit cells associated with at least one word line; and providing a charge state to a of non-volatile memory bit cell associated with at least one bit line.

9. The method of claim 8, wherein providing a charge state further comprises providing a charge state to a plurality of non-volatile memory bit cells associated with at least one bit line.

10. The method of claim 1, further comprises:
erasing a first portion of the second plurality of non-volatile memory bit cells; and
maintaining a programmed state on second portion of the second plurality of non-volatile memory bit cells during the erase procedure.

11. The method of claim 10, wherein erasing comprises erasing a first portion of the second plurality of non-volatile memory cells associated with a user accessible word line, wherein the user accessible word line comprises both a portion of a first plurality of non-volatile memory bit cells and a second plurality of non-volatile memory bit cells.

12. The method of claim 10, wherein maintaining a programmed state comprises maintaining a programmed state on a second portion of the second plurality of non-volatile memory bit cells associated with a dummy word line, wherein the dummy word line is not a user-accessible word line.

13. A method comprising:
erasing a first plurality of non-volatile memory bit cells during an erase procedure, wherein the first plurality of non-volatile memory bit cells are user programmable and physically arranged in a two dimensional array, and upon completion of the erase procedure the first plurality of non-volatile memory bit cells are at an erased state;
maintaining a programmed state on a second plurality of non-volatile memory bit cells during the erase procedure, wherein the second plurality of non-volatile memory bit cells are arranged in a periphery region abutting the two dimensional array of the first plurality of non-volatile memory bit cells.

14. The method of claim 13, wherein the second plurality of non-volatile memory bit cells are dummy non-volatile memory bit cells sharing a common word line.

15. The method of claim 14, wherein maintaining the erase state further comprises:
providing a charge state to the second plurality of non-volatile memory bit cells associated with a plurality of dummy memory cells of a word line during the erase procedure.

16. The method of claim 13, wherein the first plurality of non-volatile memory bit cells are user accessible non-volatile memory bit cells.

17. The method of claim 13, wherein erasing further comprises:
erasing a first plurality of non-volatile memory bit cells, wherein a portion of the first plurality of non-volatile memory bit cells are associated with a common word line; and
providing a programmed state to at least one non-volatile memory bit cell of the portion of the first plurality of non-volatile memory bit cells.

18. The method of claim 17, wherein providing a programmed state comprises providing a programmed state to a non-volatile memory bit cell associated with a dummy bit line, wherein the dummy bit line is associated with the second plurality of non-volatile memory bit cells.

19. A system comprising:
a control portion comprising a plurality of outputs; and
a memory block comprising a plurality of inputs coupled to the plurality of outputs, the memory block further comprising a plurality of user accessible memory bit cells, and a periphery region including one or more non-volatile charge storage structures positioned at a periphery of the plurality of user accessible memory bit cells, wherein during an erase procedure the control portion provides a charge corresponding to an erased state to the plurality of user accessible memory bit cells, and a programmed state to the one or more non-volatile charge storage structures.

20. The system of claim 19, wherein the one or more non-volatile charge storage structures are dummy structures.

* * * * *